United States Patent
Matsudai et al.

(10) Patent No.: US 11,984,473 B2
(45) Date of Patent: May 14, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tomoko Matsudai, Shibuya Tokyo (JP); Yoko Iwakaji, Meguro Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 184 days.

(21) Appl. No.: 17/472,166

(22) Filed: Sep. 10, 2021

(65) Prior Publication Data

US 2022/0302252 A1    Sep. 22, 2022

(30) Foreign Application Priority Data

Mar. 17, 2021 (JP) .................................. 2021-044115

(51) Int. Cl.
| | |
|---|---|
| *H01L 29/06* | (2006.01) |
| *H01L 27/06* | (2006.01) |
| *H01L 29/739* | (2006.01) |
| *H01L 29/861* | (2006.01) |

(52) U.S. Cl.
CPC ...... *H01L 29/0619* (2013.01); *H01L 27/0664* (2013.01); *H01L 29/7397* (2013.01); *H01L 29/8613* (2013.01)

(58) Field of Classification Search
CPC ............ H01L 29/0619; H01L 29/0664; H01L 2924/13055; H01L 29/66325–66348; H01L 9/7393–7398
See application file for complete search history.

(56) References Cited

U.S. PATENT DOCUMENTS

| | | | |
|---|---|---|---|
| 4,980,743 | A | 12/1990 | Nakagawa et al. |
| 9,929,260 | B2 | 3/2018 | Naito |
| 2009/0001411 | A1 | 1/2009 | Tokura et al. |
| 2017/0250269 | A1 | 8/2017 | Sumitomo et al. |
| 2020/0091323 | A1 | 3/2020 | Iwakaji et al. |
| 2020/0335497 | A1 | 10/2020 | Mitsuzuka et al. |

(Continued)

FOREIGN PATENT DOCUMENTS

| | | |
|---|---|---|
| JP | 64-57674 A | 3/1989 |
| JP | 2008-300474 A | 12/2008 |

(Continued)

*Primary Examiner* — Tucker J Wright
(74) *Attorney, Agent, or Firm* — Maier & Maier, PLLC

(57) ABSTRACT

A semiconductor device of embodiments includes: a transistor region including a semiconductor layer having a first face and a second face opposite to the first face, a first transistor having a first gate electrode provided on a first face side of the semiconductor layer, and a second transistor having a second gate electrode provided on a second face side of the semiconductor layer; and an adjacent region adjacent to the transistor region and including the semiconductor layer and a third transistor having a third gate electrode electrically connected to the second gate electrode and provided on the second face side of the semiconductor layer and the third transistor having an absolute value of a threshold voltage smaller than an absolute value of a threshold voltage of the second transistor.

7 Claims, 8 Drawing Sheets

(56) References Cited

U.S. PATENT DOCUMENTS

| | | |
|---|---|---|
| 2021/0057555 A1 | 2/2021 | Satoh |
| 2021/0091072 A1 | 3/2021 | Matsudai et al. |
| 2021/0091193 A1 | 3/2021 | Wakaji et al. |
| 2022/0302252 A1* | 9/2022 | Matsudai ............ H01L 27/0727 |

FOREIGN PATENT DOCUMENTS

| | | |
|---|---|---|
| JP | 2009-21557 A | 1/2009 |
| JP | 5417811 B2 | 2/2014 |
| JP | 2016-029710 A | 3/2016 |
| JP | 2020-47789 A | 3/2020 |
| JP | 6679892 B2 | 4/2020 |
| JP | 2020-177973 A | 10/2020 |
| JP | 2021-34506 A | 3/2021 |
| JP | 2021-048337 A | 3/2021 |
| JP | 2021-048338 A | 3/2021 |

* cited by examiner

SEMICONDUCTOR DEVICE

CROSS-REFERENCE TO RELATED APPLICATION

This application is based upon and claims the benefit of priority from Japanese Patent Application No. 2021-044115, filed on Mar. 17, 2021, the entire contents of which are incorporated herein by reference.

FIELD

Embodiments described herein relate generally to a semiconductor device.

BACKGROUND

An example of a power semiconductor device is an insulated gate bipolar transistor (IGBT). In the IGBT, for example, a p-type collector region, an n-type drift region, and a p-type base region are provided on a collector electrode. Then, in a trench that penetrates the p-type base region and reaches the n-type drift region, a gate electrode is provided with a gate insulating film interposed therebetween. In addition, an n-type emitter region connected to an emitter electrode is provided in a region adjacent to the trench on the surface of the p-type base region.

In recent years, a reverse-conducting IGBT (RC-IGBT) in which an IGBT and a freewheeling diode are formed in the same semiconductor chip has been widely developed and commercialized. The RC-IGBT is used, for example, as a switching element in an inverter circuit. The freewheeling diode has a function of making a current flow in a direction opposite to the on-current of the IGBT. Forming the IGBT and the freewheeling diode in the same semiconductor chip has many advantages, such as a reduction in chip size due to sharing the termination region and dispersion of heat generation locations.

In the RC-IGBT, between an IGBT region including an IGBT and a diode region including a diode, a boundary region not including the IGBT and the diode is provided. By providing the boundary region, the occurrence of a situation in which the operation of the IGBT and the operation of the diode interfere with each other to deteriorate the element characteristics of the RC-IGBT is suppressed. However, for example, due to holes injected from the back surface of the boundary region, the current may be concentrated at the end of the IGBT region to damage the IGBT.

DETAILED DESCRIPTION

Figure 1A:
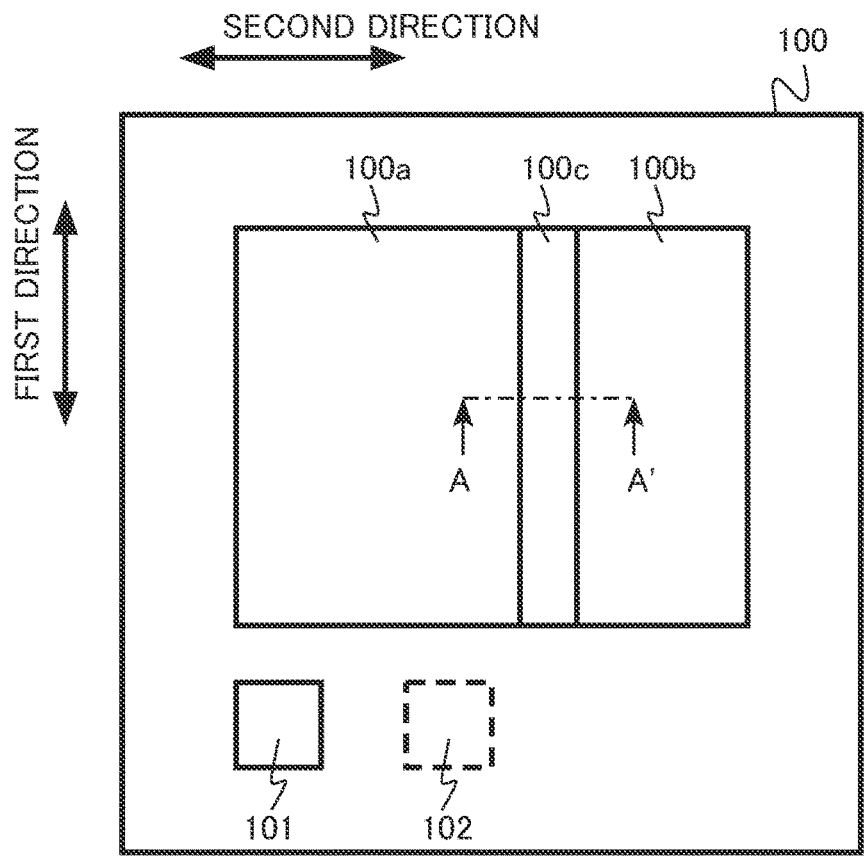
FIGS. 1A and 1B are schematic plan views of a semiconductor device of a first embodiment.

A semiconductor device of embodiments includes: a transistor region including: a semiconductor layer having a first face and a second face opposite to the first face; a first transistor having a first gate electrode provided on a first face side of the semiconductor layer; and a second transistor having a second gate electrode provided on a second face side of the semiconductor layer; and an adjacent region adjacent to the transistor region and including: the semiconductor layer; and a third transistor having a third gate electrode electrically connected to the second gate electrode and provided on the second face side of the semiconductor layer, and the third transistor having an absolute value of a threshold voltage smaller than an absolute value of a threshold voltage of the second transistor.

Hereinafter, embodiments will be described with reference to the diagrams. In the following description, the same or similar members and the like are denoted by the same reference numerals, and the description of the members and the like once described will be omitted as appropriate.

In this specification, when there is a notation of $n^+$ type, n type, and $n^-$ type, this means that the impurity concentration of n type decreases in the order of $n^+$ type, n type, and $n^-$ type. In addition, when there is a notation of $p^+$ type, p type, and $p^-$ type, this means that the impurity concentration of p type decreases in the order of $p^+$ type, p type, and $p^-$ type.

In this specification, the distribution and absolute value of the impurity concentration in a semiconductor region can be measured by using, for example, secondary ion mass spectrometry (SIMS). In addition, the relative magnitude relationship between the impurity concentrations in two semiconductor regions can be determined by using, for example, scanning capacitance microscopy (SCM). In addition, the distribution and absolute value of the impurity concentration can be measured by using, for example, spreading resistance analysis (SRA). By the SCM and the SRA, the relative magnitude relationship or absolute values of the carrier concentrations in semiconductor regions can be calculated. By assuming the activation rate of impurities, the relative magnitude relationship between the impurity concentrations in two semiconductor regions, the distribution of the impurity concentration, and the absolute value of the impurity concentration can be calculated from the measurement results of the SCM and the SRA.

First Embodiment

A semiconductor device of a first embodiment includes: a transistor region including: a semiconductor layer having a first face and a second face opposite to the first face; a first transistor having a first gate electrode provided on a first face side of the semiconductor layer; and a second transistor having a second gate electrode provided on a second face side of the semiconductor layer; and an adjacent region adjacent to the transistor region and including: the semiconductor layer; and a third transistor having a third gate electrode electrically connected to the second gate electrode and provided on the second face side of the semiconductor layer, and the third transistor having an absolute value of a threshold voltage smaller than an absolute value of a threshold voltage of the second transistor.

The semiconductor device of the first embodiment is an RC-IGBT 100 in which an IGBT and a freewheeling diode are formed in the same semiconductor chip. In addition, the RC-IGBT 100 is an IGBT having a double-sided gate structure in which a gate electrode is provided on the surface side and the back surface side of a semiconductor layer. Hereinafter, a case where the first conductive type is the n type and the second conductive type is the p type will be described as an example.

Figure 1B:
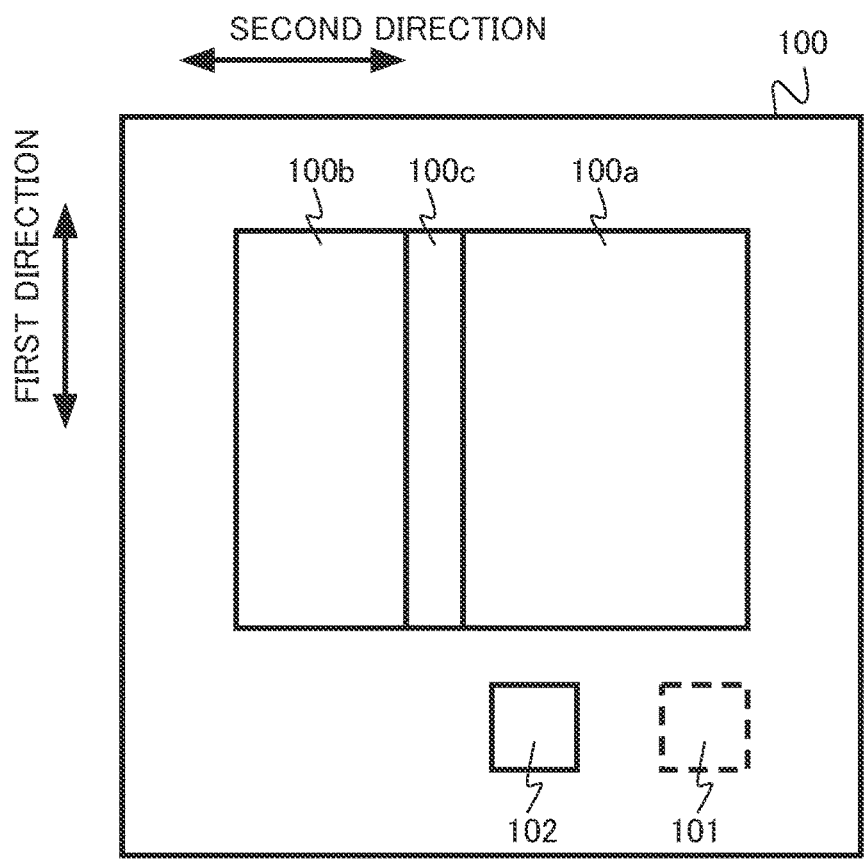

FIGS. 1A and 1B are schematic plan views of the semiconductor device of the first embodiment. FIG. 1A is a plan view of the RC-IGBT 100 viewed from the surface side of the semiconductor layer. FIG. 1B is a plan view of the RC-IGBT 100 viewed from the back surface side of the semiconductor layer. FIGS. 1A and 1B are diagrams showing the layout of the RC-IGBT 100.

The RC-IGBT 100 includes an IGBT region 100a, a diode region 100b, and a boundary region 100c. In addition, the RC-IGBT 100 includes a first electrode pad 101 and a second electrode pad 102. The IGBT region 100a is an example of a transistor region. The boundary region 100c is an example of an adjacent region.

The boundary region 100c is provided between the IGBT region 100a and the diode region 100b. The boundary region 100c is adjacent to the IGBT region 100a. The boundary region 100c suppresses the occurrence of a situation in which the operation of the IGBT in the IGBT region 100a and the operation of the diode in the diode region 100b interfere with each other to deteriorate the characteristics of the RC-IGBT 100.

The first electrode pad 101 is provided, for example, on the surface side of the semiconductor layer. The second electrode pad 102 is provided, for example, on the back surface side of the semiconductor layer.

Figure 2:
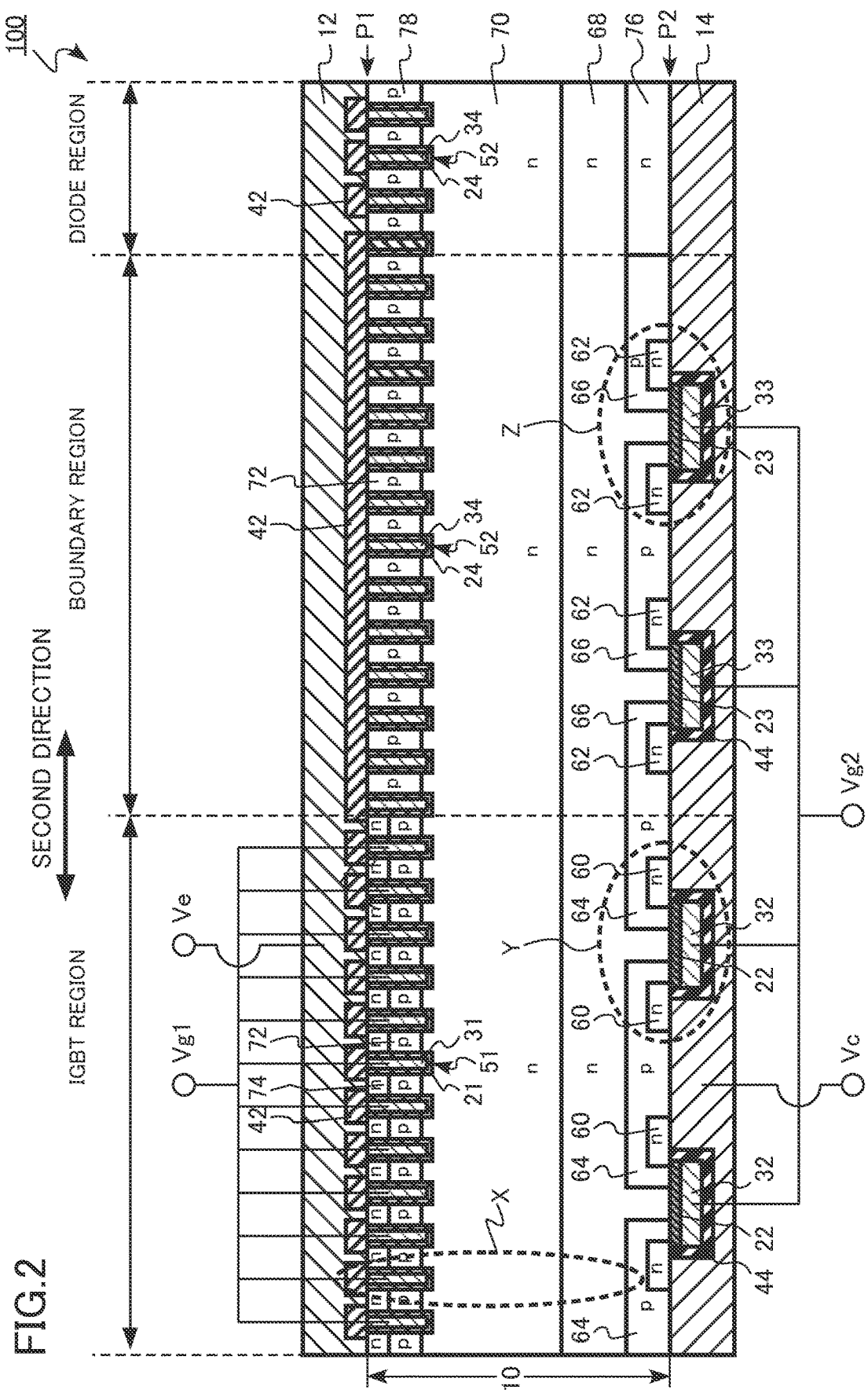
FIG. 2 is a schematic cross-sectional view of the semiconductor device of the first embodiment.

FIG. 2 is a schematic cross-sectional view of the semiconductor device of the first embodiment. FIG. 2 is a cross-sectional view taken along the line AA' of FIG. 1A.

The RC-IGBT 100 of the first embodiment includes a semiconductor layer 10, an upper electrode 12 (first electrode), a lower electrode 14 (second electrode), a first gate insulating film 21, a second gate insulating film 22, a third gate insulating film 23, a dummy gate insulating film 24, a first gate electrode 31, a second gate electrode 32, a third gate electrode 33, a dummy gate electrode 34, a surface interlayer insulating layer 42, a back surface interlayer insulating layer 44, the first electrode pad 101, and the second electrode pad 102.

The IGBT region 100a operates as an IGBT. The diode region 100b operates as a freewheeling diode. The freewheeling diode is, for example, a fast recovery diode (FRD).

The IGBT region 100a includes a first transistor having the first gate electrode 31 and a second transistor having the second gate electrode 32. The boundary region 100c includes a third transistor having the third gate electrode 33.

The first transistor is controlled by the voltage applied to the first gate electrode 31. The second transistor is controlled by the voltage applied to the second gate electrode 32. The third transistor is controlled by the voltage applied to the third gate electrode 33.

The first transistor is provided on the first face P1 side of the semiconductor layer 10. The first transistor has a trench gate structure in which a gate electrode is provided in a trench. The first transistor is an IGBT.

The second transistor is provided on the second face P2 side of the semiconductor layer 10. The second transistor has a planar gate structure. The second transistor is a so-called back surface transistor. The second transistor is an n-type metal oxide field effect transistor (MOSFET) having electrons as carriers.

The third transistor is provided on the second face P2 side of the semiconductor layer 10. The third transistor has a planar gate structure. The third transistor is a so-called back surface transistor. The third transistor is an n-type MOSFET having electrons as carriers.

The first transistor, the second transistor, and the third transistor are not clearly structurally separated from other structures. For example, a region surrounded by the broken line X in FIG. 2 corresponds to one unit of the first transistor. In addition, for example, a region surrounded by the broken line Y in FIG. 2 corresponds to one unit of the second transistor. In addition, for example, a region surrounded by the broken line Z in FIG. 2 corresponds to one unit of the third transistor.

In the semiconductor layer 10, a main gate trench 51 (first trench), a dummy gate trench 52, an n-type first drain region 60 (sixth semiconductor region), an n-type second drain region 62 (seventh semiconductor region), a p-type first collector region 64 (fourth semiconductor region), a p-type second collector region 66 (fifth semiconductor region), an n-type buffer region 68, an n-type drift region 70 (first semiconductor region), a p-type base region 72 (second semiconductor region), an n-type emitter region 74 (third semiconductor region), an n-type cathode region 76, and a p-type anode region 78 are provided.

The upper electrode 12 is an example of the first electrode. The lower electrode 14 is an example of the second electrode. The main gate trench 51 is an example of the first trench. The first drain region 60 is an example of the sixth semiconductor region. The second drain region 62 is an example of the seventh semiconductor region. The first collector region 64 is an example of the fourth semiconductor region. The second collector region 66 is an example of the fifth semiconductor region. The drift region 70 is an example of the first semiconductor region. The base region 72 is an example of the second semiconductor region. The emitter region 74 is an example of the third semiconductor region.

The semiconductor layer 10 has a first face P1 and a second face P2 opposite to the first face P1. The first face P1 is the surface of the semiconductor layer 10, and the second face P2 is the back surface of the semiconductor layer 10. The semiconductor layer 10 is, for example, single crystal silicon. The thickness of the semiconductor layer 10 is, for example, equal to or more than 40 µm and equal to or less than 700 µm.

In this specification, one direction parallel to the first face P1 is referred to as a first direction. In addition, a direction parallel to the first face P1 and perpendicular to the first direction is referred to as a second direction. In addition, in this specification, the "depth" is defined as a distance in a direction toward the second face P2 with the first face P1 as a reference.

The upper electrode 12 is provided on the first face P1 side of the semiconductor layer 10. At least a part of the upper electrode 12 is in contact with the first face P1 of the semiconductor layer 10.

In the IGBT region 100a, the upper electrode 12 functions as an emitter electrode of the first transistor. In the diode region 100b, the upper electrode 12 functions as an anode electrode of the diode. The upper electrode 12 is, for example, a metal.

The upper electrode 12 is electrically connected to the emitter region 74 in the IGBT region 100a. The upper electrode 12 is in contact with the emitter region 74 in the IGBT region 100a.

The upper electrode 12 is electrically connected to the anode region 78 in the diode region 100b. The upper electrode 12 is in contact with the anode region 78 in the diode region 100b.

An emitter voltage (Ve) is applied to the upper electrode 12. The emitter voltage is, for example, 0 V.

The lower electrode 14 is provided on the second face P2 side of the semiconductor layer 10. At least a part of the lower electrode 14 is in contact with the second face P2 of the semiconductor layer 10.

In the IGBT region 100a, the lower electrode 14 functions as a collector electrode of the first transistor. In the diode region 100b, the lower electrode 14 functions as a cathode electrode of the diode. The lower electrode 14 is, for example, a metal.

The lower electrode 14 is electrically connected to the first collector region 64 in the IGBT region 100a. The lower electrode 14 is in contact with the first collector region 64 in the IGBT region 100a.

The lower electrode 14 is electrically connected to the cathode region 76 in the diode region 100b. The lower electrode 14 is in contact with the cathode region 76 in the diode region 100b.

The lower electrode 14 is electrically connected to the second collector region 66 in the boundary region 100c. The lower electrode 14 is in contact with the second collector region 66 in the boundary region 100c.

A collector voltage (Vc) is applied to the lower electrode 14. The collector voltage is, for example, equal to or more than 200 V and equal to or less than 6500 V.

The drift region 70 is an n-type semiconductor region. The drift region 70 is provided in the IGBT region 100a, the diode region 100b, and the boundary region 100c.

The drift region 70 serves as an on-current path when the first transistor is ON. The drift region 70 has a function of being depleted when the IGBT is OFF to maintain the breakdown voltage of the IGBT.

The drift region 70 serves as an on-current path when the diode is ON. The drift region 70 has a function of being depleted when the diode is OFF to maintain the breakdown voltage of the diode.

The base region 72 is a p-type semiconductor region. The base region 72 is provided in the IGBT region 100a and the boundary region 100c. The base region 72 is provided between the drift region 70 and the first face P1. In addition, the p-type impurity concentration in the base region 72 of the boundary region 100c may be the same as or different from the p-type impurity concentration in the base region 72 of the IGBT region 100a. In addition, the p-type impurity concentration in the base region 72 of the boundary region 100c may be the same as or different from the p-type impurity concentration in the anode region 78 of the diode region 100b.

In a region of the base region 72 facing the first gate electrode 31, an n-type inversion layer is formed when the first transistor is ON. The base region 72 functions as a channel region of the first transistor. The base region 72 is electrically connected to the upper electrode 12. The base region 72 is in contact with the upper electrode 12 at a portion (not shown).

The emitter region 74 is an n-type semiconductor region. The emitter region 74 is provided in the IGBT region 100a. The emitter region 74 is not provided in the diode region 100b and the boundary region 100c.

The emitter region 74 is provided between the base region 72 and the first face P1 in the IGBT region 100a. The n-type impurity concentration in the emitter region 74 is higher than the n-type impurity concentration in the drift region 70.

The emitter region 74 is electrically connected to the upper electrode 12. The emitter region 74 is in contact with the upper electrode 12. The emitter region 74 serves as a source of electrons when the first transistor is ON.

The first collector region 64 is a p-type semiconductor region. The first collector region 64 is provided in the IGBT region 100a. The first collector region 64 is provided between the drift region 70 and the second face P2. The first collector region 64 is in contact with the second face P2.

The first collector region 64 is electrically connected to the lower electrode 14. The first collector region 64 is in contact with the lower electrode 14. The first collector region 64 serves as a source of holes when the first transistor is ON.

A part of the first collector region 64 faces the second gate electrode 32. In the first collector region 64 facing the second gate electrode 32, a channel of the second transistor controlled by the second gate electrode 32 is formed.

The second collector region 66 is a p-type semiconductor region. The second collector region 66 is provided in the boundary region 100c. The second collector region 66 is provided between the drift region 70 and the second face P2. The second collector region 66 is in contact with the second face P2.

The second collector region 66 is electrically connected to the lower electrode 14. The second collector region 66 is in contact with the lower electrode 14. The second collector region 66 serves as a source of holes when the first transistor is ON.

A part of the second collector region 66 faces the third gate electrode 33. In the second collector region 66 facing the third gate electrode 33, a channel of the third transistor controlled by the third gate electrode 33 is formed.

The p-type impurity concentration in the second collector region 66 of a portion facing the third gate electrode 33 is lower than the p-type impurity concentration in the first collector region 64 of a portion facing the second gate electrode 32. In addition, a collector region across the IGBT region 100a and the boundary region 100c may be either the first collector region 64 or the second collector region 66.

The first drain region 60 is an n-type semiconductor region. The first drain region 60 is provided in the IGBT region 100a. The first drain region 60 is provided between the first collector region 64 and the second face P2. The first drain region 60 is in contact with the second face P2.

A part of the first drain region 60 faces the second gate electrode 32. A part of the first drain region 60 is in contact with the lower electrode 14.

The first drain region 60 functions as a drain of the second transistor. The n-type impurity concentration in the first drain region 60 is higher than the n-type impurity concentration in the drift region 70.

The second drain region 62 is an n-type semiconductor region. The second drain region 62 is provided in the boundary region 100c. The second drain region 62 is provided between the second collector region 66 and the second face P2. The second drain region 62 is in contact with the second face P2.

A part of the second drain region 62 faces the second gate electrode 32. A part of the second drain region 62 is in contact with the lower electrode 14.

The second drain region 62 functions as a drain of the third transistor. The n-type impurity concentration in the second drain region 62 is higher than the n-type impurity concentration in the drift region 70.

The buffer region 68 is an n-type semiconductor region. The buffer region 68 is provided in the IGBT region 100a, the boundary region 100c, and the diode region 100b.

The buffer region 68 is provided between the drift region 70 and the first collector region 64. The buffer region 68 is provided between the drift region 70 and the cathode region 76.

A part of the buffer region 68 is in contact with the second face P2. A part of the buffer region 68 faces the second gate electrode 32. A part of the buffer region 68 faces the third gate electrode 33.

The n-type impurity concentration in the buffer region 68 is higher than the n-type impurity concentration in the drift region 70.

The buffer region 68 has a lower resistance than the drift region 70. By providing the buffer region 68, when the second transistor and the third transistor are turned on, the discharge of electrons from the drift region 70 to the lower electrode 14 through the second transistor and the third transistor is promoted.

In addition, the buffer region 68 also has a function of suppressing the extension of the depletion layer when the RC-IGBT 100 is OFF. In addition, the buffer region 68 may not be provided.

The cathode region 76 is an n-type semiconductor region. The cathode region 76 is provided in the diode region 100b. The cathode region 76 is provided between the buffer region 68 and the second face P2.

The n-type impurity concentration in the cathode region 76 is higher than the n-type impurity concentration in the buffer region 68.

The cathode region 76 is electrically connected to the lower electrode 14. The cathode region 76 is in contact with the lower electrode 14.

The anode region 78 is a p-type semiconductor region. The anode region 78 is provided in the diode region 100b. The anode region 78 is provided between the drift region 70 and the first face P1.

The anode region 78 is electrically connected to the upper electrode 12. The anode region 78 is in contact with the upper electrode 12.

The main gate trench 51 is provided in the IGBT region 100a. The main gate trench 51 is provided on the first face P1 side of the semiconductor layer 10 so as to be in contact with the base region 72.

The main gate trench 51 is a groove provided in the semiconductor layer 10. The main gate trench 51 is a part of the semiconductor layer 10.

The main gate trench 51 extends in a first direction parallel to the first face P1 on the first face P1. The main gate trench 51 has a stripe shape. A plurality of main gate trenches 51 are repeatedly arranged in a second direction perpendicular to the first direction.

The main gate trench 51 penetrates the base region 72 and reaches the drift region 70.

The first gate electrode 31 is provided in the IGBT region 100a. The first gate electrode 31 is provided on the first face P1 side of the semiconductor layer 10. The first gate electrode 31 is provided in the main gate trench 51.

The first gate electrode 31 is, for example, a semiconductor or a metal. The first gate electrode 31 is, for example, amorphous silicon or polycrystalline silicon containing n-type impurities or p-type impurities. The first gate electrode 31 is electrically connected to the first electrode pad 101.

The first gate insulating film 21 is provided between the first gate electrode 31 and the semiconductor layer 10. The first gate insulating film 21 is provided between the first gate electrode 31 and the drift region 70, between the first gate electrode 31 and the base region 72, and between the first gate electrode 31 and the emitter region 74. The first gate insulating film 21 is in contact with the drift region 70, the base region 72, and the emitter region 74. The first gate insulating film 21 is, for example, silicon oxide.

The dummy gate trench 52 is provided in the boundary region 100c and the diode region 100b. The dummy gate trench 52 is provided on the first face P1 side of the semiconductor layer 10. In addition, the dummy gate trench 52 may not be provided in the boundary region 100c or the diode region 100b.

The dummy gate trench 52 is a groove provided in the semiconductor layer 10. The dummy gate trench 52 is a part of the semiconductor layer 10.

The dummy gate trench 52 extends in the first direction parallel to the first face P1 on the first face P1. The dummy gate trench 52 has a stripe shape. A plurality of dummy gate trenches 52 are repeatedly arranged in the second direction perpendicular to the first direction.

The dummy gate trench 52 penetrates the base region 72 and reaches the drift region 70. The dummy gate trench 52 penetrates the anode region 78 and reaches the drift region 70.

The dummy gate electrode 34 is provided in the dummy gate trench 52. The dummy gate electrode 34 is, for example, a semiconductor or a metal. The dummy gate electrode 34 is, for example, amorphous silicon or polycrystalline silicon containing n-type impurities or p-type impurities.

The dummy gate electrode 34 is electrically connected to, for example, the upper electrode 12. In addition, it is also possible to put the dummy gate electrode 34 in a floating state in which the electric potential of the dummy gate electrode 34 is not fixed to a specific electric potential.

The dummy gate insulating film 24 is provided between the dummy gate electrode 34 and the semiconductor layer 10. In the boundary region 100c, the dummy gate insulating film 24 is provided between the dummy gate electrode 34 and the drift region 70 and between the dummy gate electrode 34 and the base region 72. In the diode region 100b, the dummy gate insulating film 24 is provided between the dummy gate electrode 34 and the drift region 70 and between the dummy gate electrode 34 and the anode region 78. The dummy gate insulating film 24 is, for example, silicon oxide.

The second gate electrode 32 is provided in the IGBT region 100a. The second gate electrode 32 is provided on the second face P2 side of the semiconductor layer 10.

The second gate electrode 32 is, for example, a semiconductor or a metal. The second gate electrode 32 is, for example, amorphous silicon or polycrystalline silicon containing n-type impurities or p-type impurities. The second gate electrode 32 is electrically connected to the second electrode pad 102.

The second gate insulating film 22 is provided between the second gate electrode 32 and the semiconductor layer 10. The second gate insulating film 22 is provided between the second gate electrode 32 and the first collector region 64, between the second gate electrode 32 and the first drain region 60, and between the second gate electrode 32 and the buffer region 68. The second gate insulating film 22 is in contact with the first collector region 64, the first drain region 60, and the buffer region 68. The second gate insulating film 22 is, for example, silicon oxide.

The third gate electrode 33 is provided in the boundary region 100c. The third gate electrode 33 is provided on the second face P2 side of the semiconductor layer 10.

The third gate electrode 33 is, for example, a semiconductor or a metal. The third gate electrode 33 is, for example, amorphous silicon or polycrystalline silicon containing n-type impurities or p-type impurities. The third gate electrode 33 is electrically connected to the second electrode pad 102.

The third gate insulating film 23 is provided between the third gate electrode 33 and the semiconductor layer 10. The third gate insulating film 23 is provided between the third gate electrode 33 and the second collector region 66, between the third gate electrode 33 and the second drain region 62, and between the third gate electrode 33 and the buffer region 68. The third gate insulating film 23 is in contact with the second collector region 66, the second drain region 62, and the buffer region 68. The third gate insulating film 23 is, for example, silicon oxide.

The surface interlayer insulating layer 42 is provided between the first gate electrode 31 and the upper electrode 12. The surface interlayer insulating layer 42 electrically separates the first gate electrode 31 from the upper electrode 12. The surface interlayer insulating layer 42 is, for example, silicon oxide.

The back surface interlayer insulating layer 44 is provided between the second gate electrode 32 and the lower electrode 14. The back surface interlayer insulating layer 44 electrically separates the second gate electrode 32 from the lower electrode 14. The back surface interlayer insulating layer 44 is provided between the third gate electrode 33 and the lower electrode 14. The back surface interlayer insulating layer 44 electrically separates the third gate electrode 33 from the lower electrode 14. The back surface interlayer insulating layer 44 is, for example, silicon oxide.

The first electrode pad 101 is provided on the first face P1 side of the semiconductor layer 10. The first electrode pad 101 is electrically connected to the first gate electrode 31. The first electrode pad 101 and the first gate electrode 31 are connected to each other by, for example, a metal wiring (not shown). A first gate voltage (Vg1) is applied to the first electrode pad 101.

The second electrode pad 102 is provided on the second face P2 side of the semiconductor layer 10. The second electrode pad 102 is electrically connected to the second gate electrode 32 and the third gate electrode 33. The second electrode pad 102 and each of the second gate electrode 32 and the third gate electrode 33 are connected to each other by, for example, a metal wiring (not shown). A second gate voltage (Vg2) is applied to the second electrode pad 102.

The absolute value of the threshold voltage of the third transistor of the RC-IGBT 100 is lower than the threshold voltage of the second transistor. In the RC-IGBT 100, the second transistor and the third transistor are n-type MOSFETs. Therefore, the threshold voltage of the second transistor and the threshold voltage of the third transistor are positive values. Therefore, the threshold voltage of the third transistor is lower than the threshold voltage of the second transistor.

The threshold voltage of the third transistor having the third gate electrode 33 is, for example, equal to or less than two-thirds of the threshold voltage of the second transistor having the second gate electrode 32.

The p-type impurity concentration in the second collector region 66 of a portion facing the third gate electrode 33 is lower than the p-type impurity concentration in the first collector region 64 of a portion facing the second gate electrode 32. Since the p-type impurity concentration in the second collector region 66 of a portion facing the third gate electrode 33 is lower than the p-type impurity concentration in the first collector region 64 of a portion facing the second gate electrode 32, the threshold voltage of the third transistor is lower than the threshold voltage of the second transistor.

Next, a method of driving the RC-IGBT 100 will be described.

Figure 3:
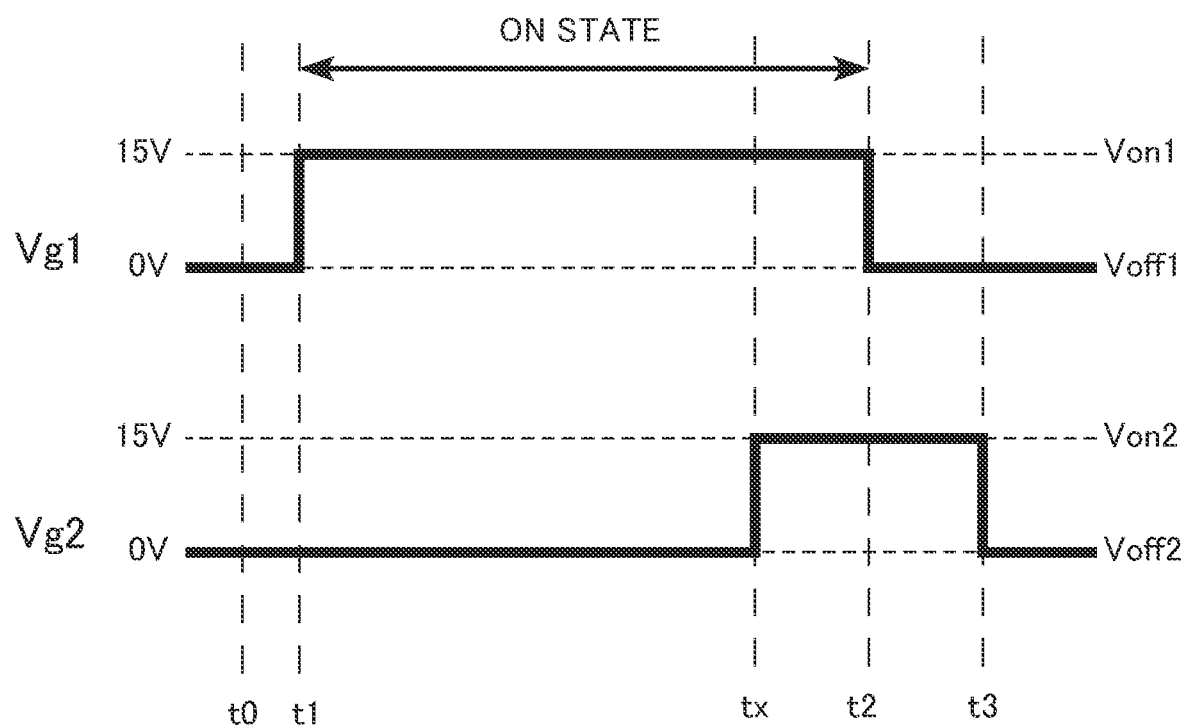
FIG. 3 is an explanatory diagram of a method of driving the semiconductor device of the first embodiment.

FIG. 3 is an explanatory diagram of a method of driving the semiconductor device of the first embodiment. FIG. 3 is a timing chart of the first gate voltage (Vg1) applied to the first electrode pad 101 and the second gate voltage (Vg2) applied to the second electrode pad 102.

When the RC-IGBT 100 is OFF, an emitter voltage (Ve) is applied to the upper electrode 12. For example, at time t0, the emitter voltage (Ve) is applied to the upper electrode 12. The emitter voltage (Ve) is, for example, 0 V.

When the RC-IGBT 100 is OFF, a collector voltage (Vc) is applied to the lower electrode 14. The collector voltage (Vc) is, for example, equal to or more than 200 V and equal to or less than 6500 V. A collector-emitter voltage (Vce) applied between the lower electrode 14 and the upper electrode 12 is, for example, equal to or more than 200 V and equal to or less than 6500 V.

In addition, the first gate voltage (Vg1) is a voltage when the emitter voltage (Ve) is a reference voltage. In addition, the second gate voltage (Vg2) is a voltage when the collector voltage (Vc) is a reference voltage.

First, the change timing of the first gate voltage (Vg1) applied to the first transistor will be described.

For example, at time t0, a first turn-off voltage (Voff1) is applied as the first gate voltage (Vg1). The first turn-off voltage (Voff1) is a voltage equal to or less than the threshold voltage at which the first transistor is not turned on.

The first turn-off voltage (Voff1) is, for example, 0 V or a negative voltage. FIG. 3 illustrates a case where the first turn-off voltage (Voff1) is 0 V.

At time t1, a first turn-on voltage (Von1) is applied as the first gate voltage (Vg1). The first turn-on voltage (Von1) is a positive voltage that exceeds the threshold voltage of the first transistor. FIG. 3 illustrates a case where the first turn-on voltage (Von1) is 15 V.

When the first turn-on voltage (Von1) is applied to the first transistor, the RC-IGBT 100 is turned on. The RC-IGBT 100 is turned on at time t1.

By applying the first turn-on voltage (Von1) to the first transistor, an n-type inversion layer is formed in the vicinity of the interface between the p-type base region 72 and the first gate insulating film 21. By forming the n-type inversion layer, electrons are injected from the n-type emitter region 74 into the n-type drift region 70 through the n-type inversion layer.

The electrons injected into the n-type drift region 70 forward bias the pn junction formed between the n-type buffer region 68 and the p-type first collector region 64 and between the n-type buffer region 68 and the p-type second collector region 66. The electrons reach the lower electrode 14 and cause hole injection from the p-type first collector region 64 and the p-type second collector region 66. Therefore, the RC-IGBT 100 is turned on.

At time t2, the first turn-off voltage (Voff1) is applied as the first gate voltage (Vg1). When the first turn-off voltage (Voff1) is applied to the first transistor, the RC-IGBT 100 is turned off. Between time t1 and time t2, the RC-IGBT 100 is ON.

Next, the change timing of the second gate voltage (Vg2) applied to the second transistor and the third transistor, which are the back surface transistors, will be described.

For example, at time t0, a second turn-off voltage (Voff2) is applied as the second gate voltage (Vg2). The second turn-off voltage (Voff2) is a voltage equal to or less than the threshold voltage at which the second transistor and the third transistor are not turned on.

The second turn-off voltage (Voff2) is, for example, 0 V or a negative voltage. FIG. 3 illustrates a case where the second turn-off voltage (Voff2) is 0 V.

At time tx after time t1, a second turn-on voltage (Von2) is applied as the second gate voltage (Vg2). The second turn-on voltage (Von2) is a positive voltage that exceeds the threshold voltage of the second transistor and the third transistor. FIG. 3 illustrates a case where the second turn-on voltage (Von2) is 15 V.

In addition, the time tx may be before the time t2 or after the time t2. FIG. 3 illustrates a case where the time tx is before the time t2.

By applying the second turn-on voltage (Von2) to the second transistor, an n-type inversion layer is formed in the vicinity of the interface between the p-type first collector region 64 and the second gate insulating film 22. In addition, by applying the second turn-on voltage (Von2) to the third transistor, an n-type inversion layer is formed in the vicinity of the interface between the p-type second collector region 66 and the third gate insulating film 23.

By forming the n-type inversion layer in the vicinity of the interface between the p-type first collector region 64 and the second gate insulating film 22, a path is formed in which electrons are discharged from the n-type buffer region 68 of the IGBT region 100*a* to the lower electrode 14 through the n-type inversion layer and the n-type first drain region 60.

In addition, by forming the n-type inversion layer in the vicinity of the interface between the p-type second collector region 66 and the third gate insulating film 23, a path is formed in which electrons are discharged from the n-type buffer region 68 of the boundary region 100*c* to the lower electrode 14 through the n-type inversion layer and the n-type second drain region 62.

That is, a state in which the n-type buffer region 68 of the IGBT region 100*a* and the boundary region 100*c* and the lower electrode 14 are short-circuited, a so-called anode short circuit occurs.

The occurrence of the anode short circuit prevents electrons from reaching the lower electrode 14 from the n-type buffer region 68 of the IGBT region 100*a* through the p-type first collector region 64. Therefore, the injection of holes from the p-type first collector region 64 into the drift region 70 of the IGBT region 100*a* is suppressed.

Similarly, the occurrence of the anode short circuit prevents electrons from reaching the lower electrode 14 from the n-type buffer region 68 of the boundary region 100*c* through the p-type second collector region 66. Therefore, the injection of holes from the p-type second collector region 66 into the drift region 70 of the boundary region 100*c* is suppressed.

In addition, in the RC-IGBT 100 of the first embodiment, the threshold voltage of the third transistor in the boundary region 100*c* is lower than the threshold voltage of the second transistor in the IGBT region 100*a*. Therefore, when the second turn-on voltage (Von2) is applied to the second gate electrode 32 and the third gate electrode 33 at the same time at time tx, the third transistor having a low threshold voltage is turned on before the second transistor is turned on.

Therefore, the injection of holes into the drift region 70 of the boundary region 100*c* is suppressed before the injection of holes into the drift region 70 of the IGBT region 100*a*. As a result, the amount of holes in the drift region 70 of the boundary region 100*c* is reduced before the amount of holes in the drift region 70 of the IGBT region 100*a* is reduced.

Then, at time t3, the second turn-off voltage (Voff2) is applied as the second gate voltage (Vg2) to turn off the second transistor and the third transistor.

Next, the function and effect of the semiconductor device of the first embodiment will be described.

The RC-IGBT 100 of the first embodiment includes a second transistor as a back surface transistor on the back surface side of the semiconductor layer 10 in the IGBT region 100*a*. By turning on the second transistor during the turn-off operation of the RC-IGBT 100, the injection of holes into the drift region 70 of the IGBT region 100*a* is suppressed. By suppressing the injection of holes into the drift region 70, the turn-off loss is reduced as compared with a case where the back surface transistor is not provided. Therefore, it is possible to reduce the power consumption of the RC-IGBT 100.

In addition, in the RC-IGBT 100 of the first embodiment, the boundary region 100*c* not including the first transistor and the diode is provided between the IGBT region 100*a* and the diode region 100*b*. The boundary region 100*c* suppresses the occurrence of a situation in which the operation of the IGBT in the IGBT region 100*a* and the operation of the diode in the diode region 100*b* interfere with each other to deteriorate the characteristics of the RC-IGBT 100. For example, it is possible to suppress an increase in the recovery loss of the diode due to the influence of carriers injected from the IGBT region 100*a* during the recovery operation of the diode.

When the RC-IGBT 100 is ON, an on-current also flows between the upper electrode 12 and the lower electrode 14 in the boundary region 100*c*. Therefore, when the RC-IGBT 100 is ON, carriers are also accumulated in the drift region 70 of the boundary region 100*c*. In other words, when the RC-IGBT 100 is ON, carriers spread up to the boundary region 100*c* where the first transistor is not present on the surface.

During the turn-off operation of the RC-IGBT 100, it is necessary to discharge the carriers accumulated in the drift region 70 of the boundary region 100*c*. However, there is no carrier discharge path on the surface side of the boundary region 100*c*. For this reason, the carriers are concentrated and discharged at the end of the IGBT region 100*a*. As a result, current concentration occurs at the end of the IGBT region 100*a*. Therefore, there is a possibility that the RC-IGBT 100 will be damaged due to current concentration.

The RC-IGBT 100 of the first embodiment includes a third transistor, which starts operating before the second transistor operates because the threshold voltage is low, on the back surface side of the semiconductor layer 10 in the boundary region 100*c*. By turning on the third transistor at time tx, the injection of holes into the drift region 70 of the boundary region 100*c* is suppressed before the injection of holes into the drift region 70 of the IGBT region 100*a*. As a result, the amount of holes in the drift region 70 of the boundary region 100*c* is reduced before the amount of holes in the drift region 70 of the IGBT region 100*a* is reduced.

Therefore, it is possible to suppress the occurrence of current concentration at the end of the IGBT region 100*a* during the turn-off operation of the RC-IGBT 100. As a result, damage to the RC-IGBT 100 due to current concentration can be suppressed.

From the viewpoint of suppressing the damage to the RC-IGBT 100 due to current concentration, the threshold voltage of the third transistor having the third gate electrode 33 is preferably equal to or less than two-thirds of the threshold voltage of the second transistor having the second gate electrode 32, more preferably half the threshold voltage of the second transistor having the second gate electrode 32.

A first modification example of the semiconductor device of the first embodiment is different from the semiconductor device of the first embodiment in that the thickness of the third gate insulating film 23 is smaller than the thickness of the second gate insulating film 22. In the first modification example of the semiconductor device of the first embodiment, for example, the p-type impurity concentration in the second collector region 66 of a portion facing the third gate electrode 33 is equal to the p-type impurity concentration in the first collector region 64 of a portion facing the second gate electrode 32.

In the first modification example of the semiconductor device of the first embodiment, since the thickness of the third gate insulating film 23 is smaller than the thickness of the second gate insulating film 22, the threshold voltage of the third transistor is lower than the threshold voltage of the second transistor.

A second modification example of the semiconductor device of the first embodiment is different from the semiconductor device of the first embodiment in that the channel length of the third transistor is smaller than the channel length of the second transistor. Specifically, for example, the distance in the second direction between the second drain region 62 of the boundary region 100c and the buffer region 68 is set to be smaller than the distance in the second direction between the first drain region 60 of the IGBT region 100a and the buffer region 68, so that the channel length of the third transistor becomes smaller than the channel length of the second transistor. In the second modification example of the semiconductor device of the first embodiment, for example, the p-type impurity concentration in the second collector region 66 of a portion facing the third gate electrode 33 is equal to the p-type impurity concentration in the first collector region 64 of a portion facing the second gate electrode 32.

In the second modification example of the semiconductor device of the first embodiment, the channel length of the third transistor is set to be smaller than the channel length of the second transistor, so that the threshold voltage of the third transistor becomes lower than the threshold voltage of the second transistor due to the short channel effect.

As described above, according to the first embodiment and its modification examples, it is possible to realize an RC-IGBT in which damage due to current concentration is suppressed.

Second Embodiment

A semiconductor device of a second embodiment includes: a transistor region including a semiconductor layer having a first face and a second face opposite to the first face, a first transistor having a first gate electrode provided on a side of the first face of the semiconductor layer, and a second transistor having a second gate electrode provided on a side of the second face of the semiconductor layer; and an adjacent region adjacent to the transistor region and including the semiconductor layer and a third transistor having a third gate electrode electrically connected to the second gate electrode, having an occupancy ratio in a predetermined area higher than an occupancy ratio of the second gate electrode in the predetermined area, and provided on the side of the second face of the semiconductor layer.

The semiconductor device of the second embodiment is different from the semiconductor device of the first embodiment in that the occupancy ratio of the third gate electrode in a predetermined area is higher than the occupancy ratio of the second gate electrode in the predetermined area. Hereinafter, the description of a part of the content overlapping the first embodiment may be omitted.

The semiconductor device of the second embodiment is an RC-IGBT 200 in which an IGBT and a freewheeling diode are formed in the same semiconductor chip. In addition, the RC-IGBT 200 is an IGBT having a double-sided gate structure in which a gate electrode is provided on the surface side and the back surface side of a semiconductor layer. Hereinafter, a case where the first conductive type is the n type and the second conductive type is the p type will be described as an example.

Figure 4:
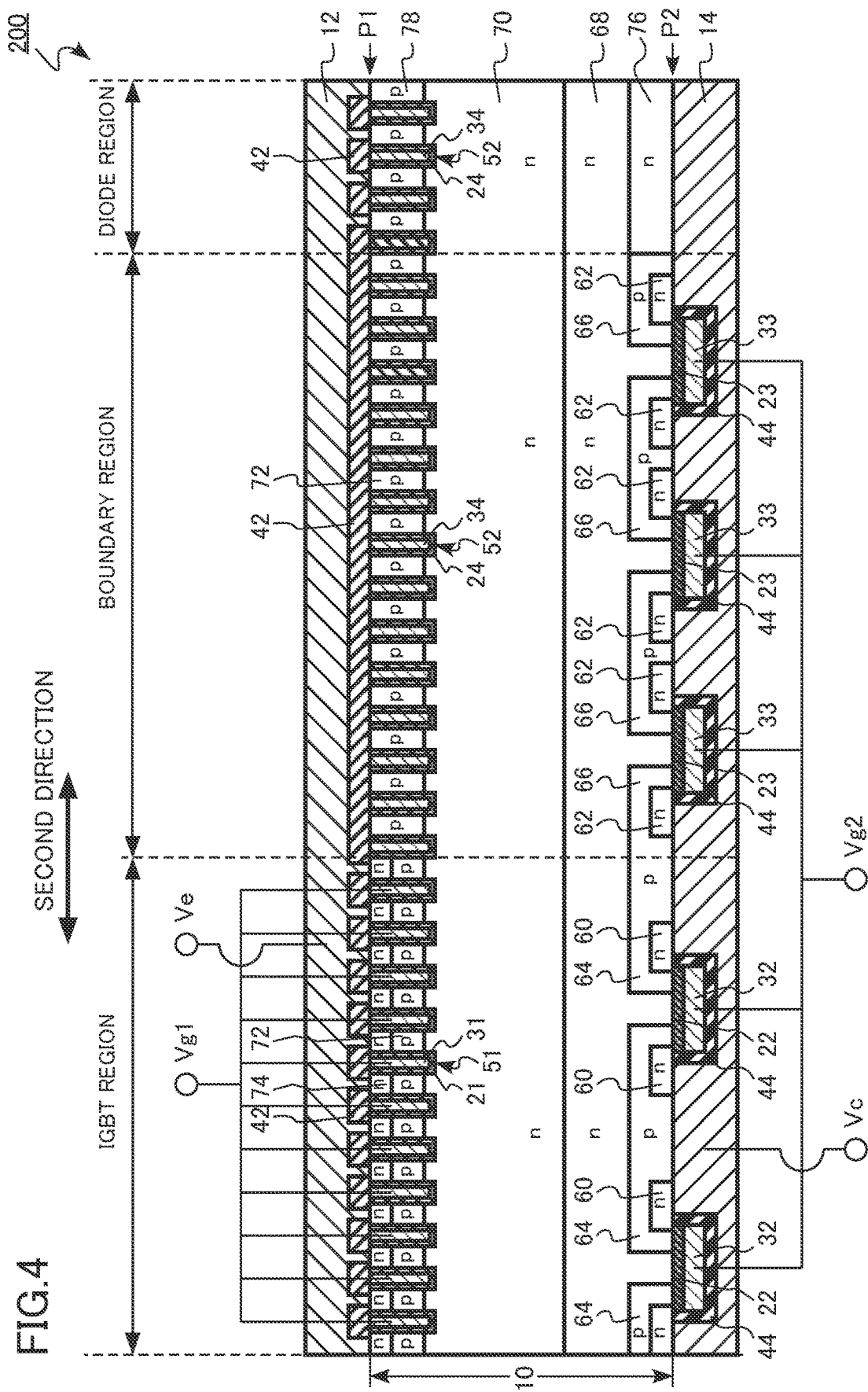
FIG. 4 is a schematic cross-sectional view of a semiconductor device of a second embodiment.

FIG. 4 is a schematic cross-sectional view of the semiconductor device of the second embodiment. FIG. 4 is a diagram corresponding to FIG. 2 of the semiconductor device of the first embodiment.

The RC-IGBT 200 of the second embodiment includes a semiconductor layer 10, an upper electrode 12 (first electrode), a lower electrode 14 (second electrode), a first gate insulating film 21, a second gate insulating film 22, a third gate insulating film 23, a dummy gate insulating film 24, a first gate electrode 31, a second gate electrode 32, a third gate electrode 33, a dummy gate electrode 34, a surface interlayer insulating layer 42, a back surface interlayer insulating layer 44, a first electrode pad 101, and a second electrode pad 102.

In the semiconductor layer 10, a main gate trench 51 (first trench), a dummy gate trench 52, an n-type first drain region 60 (sixth semiconductor region), an n-type second drain region 62 (seventh semiconductor region), a p-type first collector region 64 (fourth semiconductor region), a p-type second collector region 66 (fifth semiconductor region), an n-type buffer region 68, an n-type drift region 70 (first semiconductor region), a p-type base region 72 (second semiconductor region), an n-type emitter region 74 (third semiconductor region), an n-type cathode region 76, and a p-type anode region 78 are provided.

In the RC-IGBT 200, the occupancy ratio of the third gate electrode 33 in the boundary region 100c in a predetermined area is higher than the occupancy ratio of the second gate electrode 32 in the IGBT region 100a in the predetermined area. In other words, the density of the third gate electrodes 33 in the boundary region 100c is higher than that of the second gate electrodes 32 in the IGBT region 100a. That is, the density of the third transistors in the boundary region 100c is higher than the density of the second transistors in the IGBT region 100a.

In the RC-IGBT 200, the distance between adjacent third gate electrodes 33 is smaller than the distance between adjacent second gate electrodes 32. By making the distance between the adjacent third gate electrodes 33 smaller than the distance between the adjacent second gate electrodes 32, the occupancy ratio of the third gate electrode 33 in the boundary region 100c in a predetermined area is higher than the occupancy ratio of the second gate electrode 32 in the IGBT region 100a in the predetermined area.

The predetermined area is an area on the second face P2 that can include the boundary region 100c. The predetermined area is, for example, an area of 50 μm×50 μm.

The occupancy ratio of the third gate electrode 33 in the boundary region 100c in a predetermined area is, for example, equal to or more than 1.5 times the occupancy ratio of the second gate electrode 32 in the IGBT region 100a in the predetermined area.

In the RC-IGBT 200, the threshold voltage of the third transistor and the threshold voltage of the second transistor are the same, for example. In the RC-IGBT 200, for example, the p-type impurity concentration in the second collector region 66 of a portion facing the third gate electrode 33 is equal to the p-type impurity concentration in the first collector region 64 of a portion facing the second gate electrode 32.

The RC-IGBT 200 is driven by the driving method shown in FIG. 3 of the first embodiment.

By applying the second turn-on voltage (Von2) to the second transistor and the third transistor at time tx, an anode short circuit occurs as in the RC-IGBT 100 of the first embodiment.

The occurrence of the anode short circuit prevents electrons from reaching the lower electrode 14 from the n-type buffer region 68 of the IGBT region 100a through the p-type first collector region 64. Therefore, the injection of holes from the p-type first collector region 64 into the drift region 70 of the IGBT region 100a is suppressed.

Similarly, the occurrence of the anode short circuit prevents electrons from reaching the lower electrode 14 from the n-type buffer region 68 of the boundary region 100c through the p-type second collector region 66. Therefore, the injection of holes from the p-type second collector region 66 into the drift region 70 of the boundary region 100c is suppressed.

In the RC-IGBT 200 of the second embodiment, the density of the third transistors in the boundary region 100c is higher than the density of the second transistors in the IGBT region 100a. Therefore, when the second turn-on voltage (Von2) is applied to the second gate electrode 32 and the third gate electrode 33 at the same time at time tx, the amount of reduction in the injection of holes into the drift region 70 of the boundary region 100c is larger than the amount of reduction in the injection of holes into the drift region 70 of the IGBT region 100a. As a result, the amount of holes in the drift region 70 of the boundary region 100c is reduced before the amount of holes in the drift region 70 of the IGBT region 100a is reduced.

Therefore, it is possible to suppress the occurrence of current concentration at the end of the IGBT region 100a during the turn-off operation of the RC-IGBT 200. As a result, damage to the RC-IGBT 200 due to current concentration can be suppressed.

From the viewpoint of suppressing the damage to the RC-IGBT 200 due to current concentration, the occupancy ratio of the third gate electrode 33 in the boundary region 100c in a predetermined area is preferably, for example, equal to or more than 1.5 times the occupancy ratio of the second gate electrode 32 in the IGBT region 100a in the predetermined area, more preferably equal to or more than twice the occupancy ratio of the second gate electrode 32 in the IGBT region 100a in the predetermined area.

As described above, according to the second embodiment, it is possible to realize an RC-IGBT in which damage due to current concentration is suppressed.

Third Embodiment

A semiconductor device of a third embodiment is different from the semiconductor device of the second embodiment in that the semiconductor layer further includes a second trench provided on the second face side and a third trench provided on the second face side, the second gate electrode is provided in the second trench, and the third gate electrode is provided in the third trench. Hereinafter, the description of a part of the content overlapping the first or second embodiment may be omitted.

The semiconductor device of the third embodiment is an RC-IGBT 300 in which an IGBT and a freewheeling diode are formed in the same semiconductor chip. In addition, the RC-IGBT 300 is an IGBT having a double-sided gate structure in which a gate electrode is provided on the surface side and the back surface side of a semiconductor layer. Hereinafter, a case where the first conductive type is the n type and the second conductive type is the p type will be described as an example.

Figure 5:
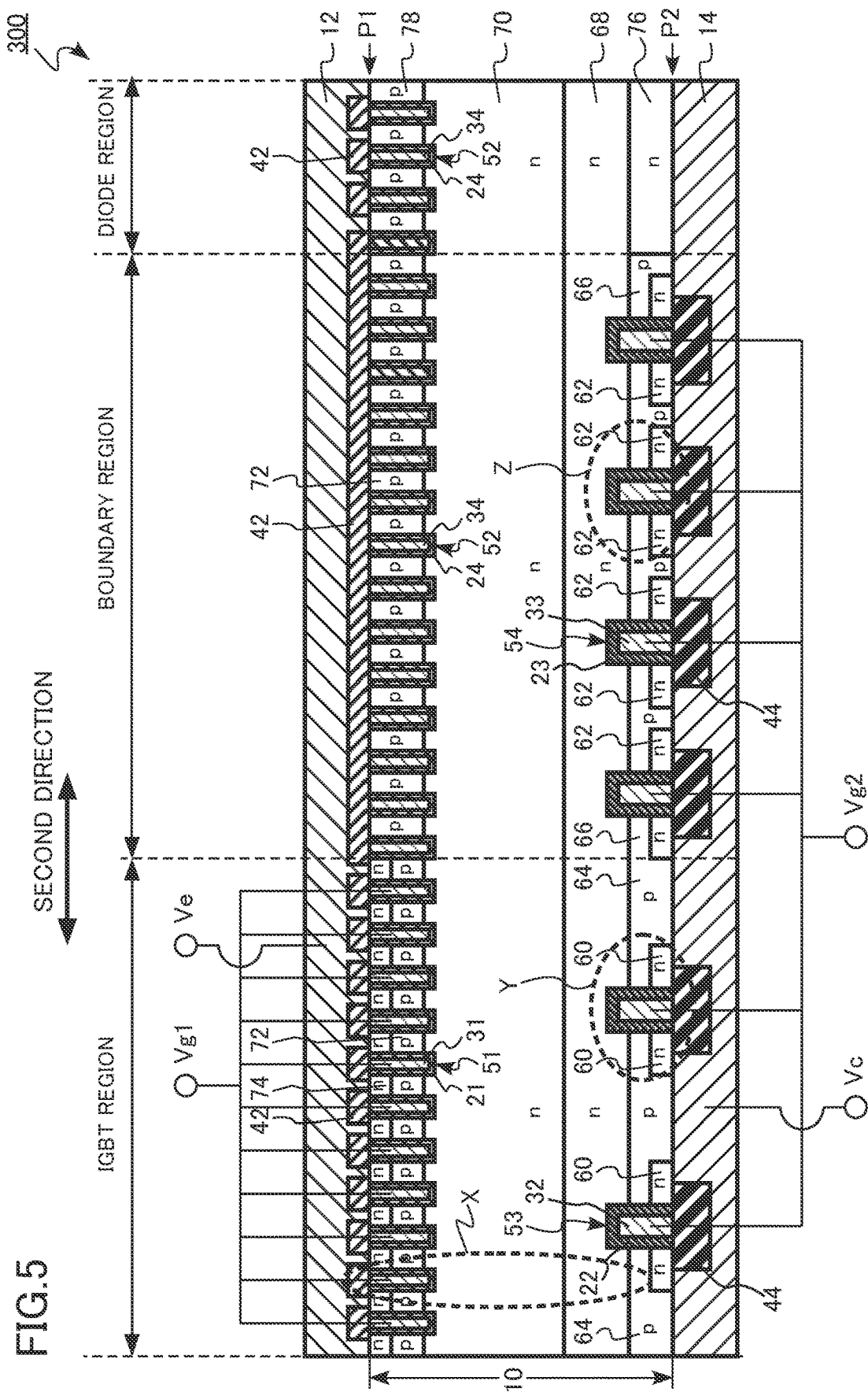
FIG. 5 is a schematic cross-sectional view of a semiconductor device of a third embodiment.

FIG. 5 is a schematic cross-sectional view of the semiconductor device of the third embodiment. FIG. 5 is a diagram corresponding to FIG. 2 of the semiconductor device of the first embodiment.

The RC-IGBT 300 of the third embodiment includes a semiconductor layer 10, an upper electrode 12 (first electrode), a lower electrode 14 (second electrode), a first gate insulating film 21, a second gate insulating film 22, a third gate insulating film 23, a dummy gate insulating film 24, a first gate electrode 31, a second gate electrode 32, a third gate electrode 33, a dummy gate electrode 34, a surface interlayer insulating layer 42, a back surface interlayer insulating layer 44, a first electrode pad 101, and a second electrode pad 102.

In the semiconductor layer 10, a main gate trench 51 (first trench), a dummy gate trench 52, a first back surface trench 53 (second trench), a second back surface trench 54 (third trench), an n-type first drain region 60 (sixth semiconductor region), an n-type second drain region 62 (seventh semiconductor region), a p-type first collector region 64 (fourth semiconductor region), a p-type second collector region 66 (fifth semiconductor region), an n-type buffer region 68, an n-type drift region 70 (first semiconductor region), a p-type base region 72 (second semiconductor region), an n-type emitter region 74 (third semiconductor region), an n-type cathode region 76, and a p-type anode region 78 are provided.

The main gate trench 51 is an example of the first trench. The first back surface trench 53 is an example of the second trench. The second back surface trench 54 is an example of the third trench.

The first transistor is provided on the first face P1 side of the semiconductor layer 10. The first transistor has a trench gate structure in which a gate electrode is provided in a trench. The first transistor is an IGBT.

The second transistor is provided on the second face P2 side of the semiconductor layer 10. The second transistor has a trench gate structure. The second transistor is a so-called back surface transistor. The second transistor is an n-type MOSFET having electrons as carriers.

The third transistor is provided on the second face P2 side of the semiconductor layer 10. The third transistor has a trench gate structure. The third transistor is a so-called back surface transistor. The third transistor is an n-type MOSFET having electrons as carriers.

The first transistor, the second transistor, and the third transistor are not clearly structurally separated from other structures. For example, a region surrounded by the broken line X in FIG. 5 corresponds to one unit of the first transistor. In addition, for example, a region surrounded by the broken line Y in FIG. 5 corresponds to one unit of the second transistor. In addition, for example, a region surrounded by the broken line Z in FIG. 5 corresponds to one unit of the third transistor.

In the RC-IGBT 300, the occupancy ratio of the third gate electrode 33 in the boundary region 100c in a predetermined area is higher than the occupancy ratio of the second gate electrode 32 in the IGBT region 100a in the predetermined area. That is, the density of the third transistors in the boundary region 100c is higher than the density of the second transistors in the IGBT region 100a.

In the RC-IGBT 300, the distance between adjacent third gate electrodes 33 is smaller than the distance between adjacent second gate electrodes 32. By making the distance between the adjacent third gate electrodes 33 smaller than the distance between the adjacent second gate electrodes 32, the occupancy ratio of the third gate electrode 33 in the boundary region 100c in a predetermined area is higher than the occupancy ratio of the second gate electrode 32 in the IGBT region 100a in the predetermined area.

The RC-IGBT 300 is driven by the driving method shown in FIG. 3 of the first embodiment.

In the RC-IGBT 300 of the third embodiment, the density of the third transistors in the boundary region 100c is higher than the density of the second transistors in the IGBT region 100a. Therefore, similar to the RC-IGBT 200 of the second embodiment, it is possible to suppress the occurrence of current concentration at the end of the IGBT region 100a during the turn-off operation of the RC-IGBT 300. As a result, damage to the RC-IGBT 100 due to current concentration can be suppressed.

As described above, according to the third embodiment, it is possible to realize an RC-IGBT in which damage due to current concentration is suppressed.

Fourth Embodiment

A semiconductor device of a fourth embodiment is different from the semiconductor device of the first embodiment in that a termination region is provided. Hereinafter, the description of a part of the content overlapping the first embodiment may be omitted.

The semiconductor device of the fourth embodiment is an IGBT 400 having a double-sided gate structure in which a gate electrode is provided on the surface side and the back surface side of a semiconductor layer. Hereinafter, a case where the first conductive type is the n type and the second conductive type is the p type will be described as an example.

Figure 6A:
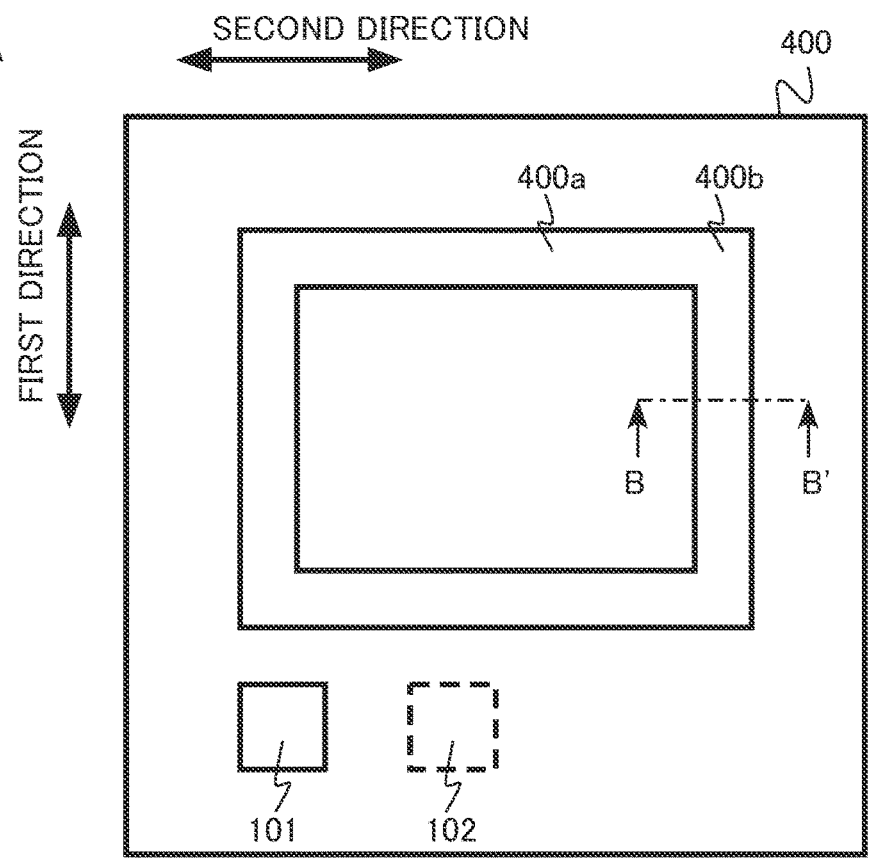
FIGS. 6A and 6B are schematic plan views of a semiconductor device of a fourth embodiment.
Figure 6B:
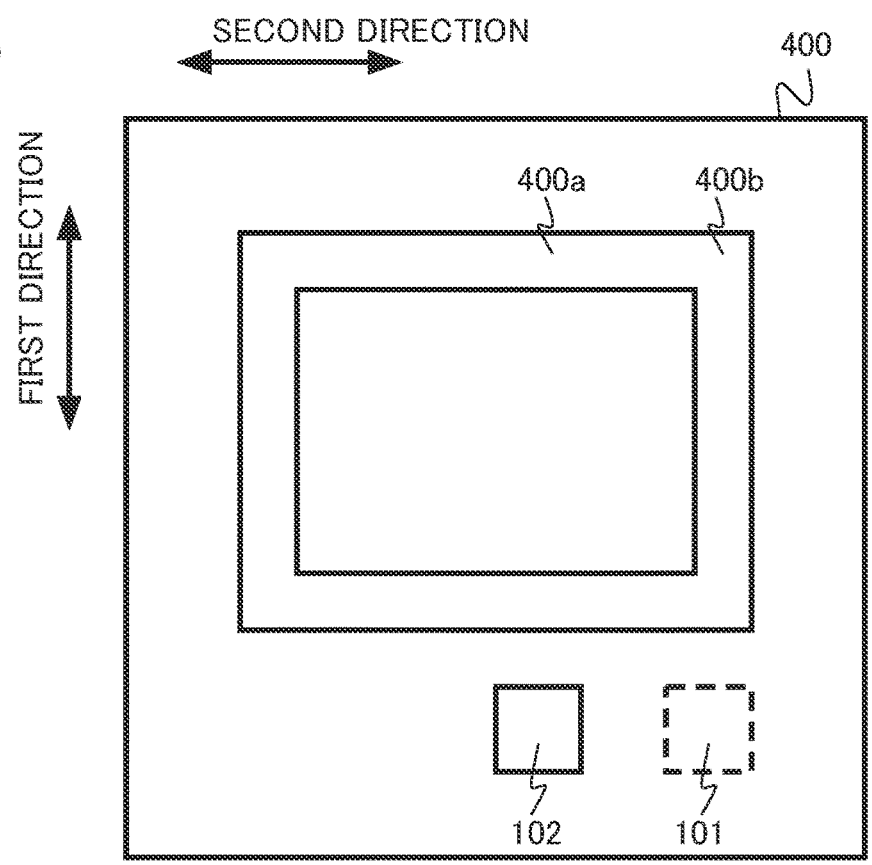

FIGS. 6A and 6B are schematic plan views of the semiconductor device of the fourth embodiment. FIG. 6A is a plan view of the IGBT 400 viewed from the surface side of the semiconductor layer. FIG. 6B is a plan view of the IGBT 400 viewed from the back surface side of the semiconductor layer. FIGS. 6A and 6B are diagrams showing the layout of the IGBT 400.

The IGBT 400 includes an IGBT region 400a and a termination region 400b. The termination region 400b surrounds the IGBT region 400a. The termination region 400b is adjacent to the IGBT region 400a.

In addition, the IGBT 400 includes a first electrode pad 101 and a second electrode pad 102. The first electrode pad 101 is provided, for example, on the surface side of the semiconductor layer. The second electrode pad 102 is provided, for example, on the back surface side of the semiconductor layer.

The IGBT region 400a is an example of a transistor region. The termination region 400b is an example of an adjacent region.

Figure 7:
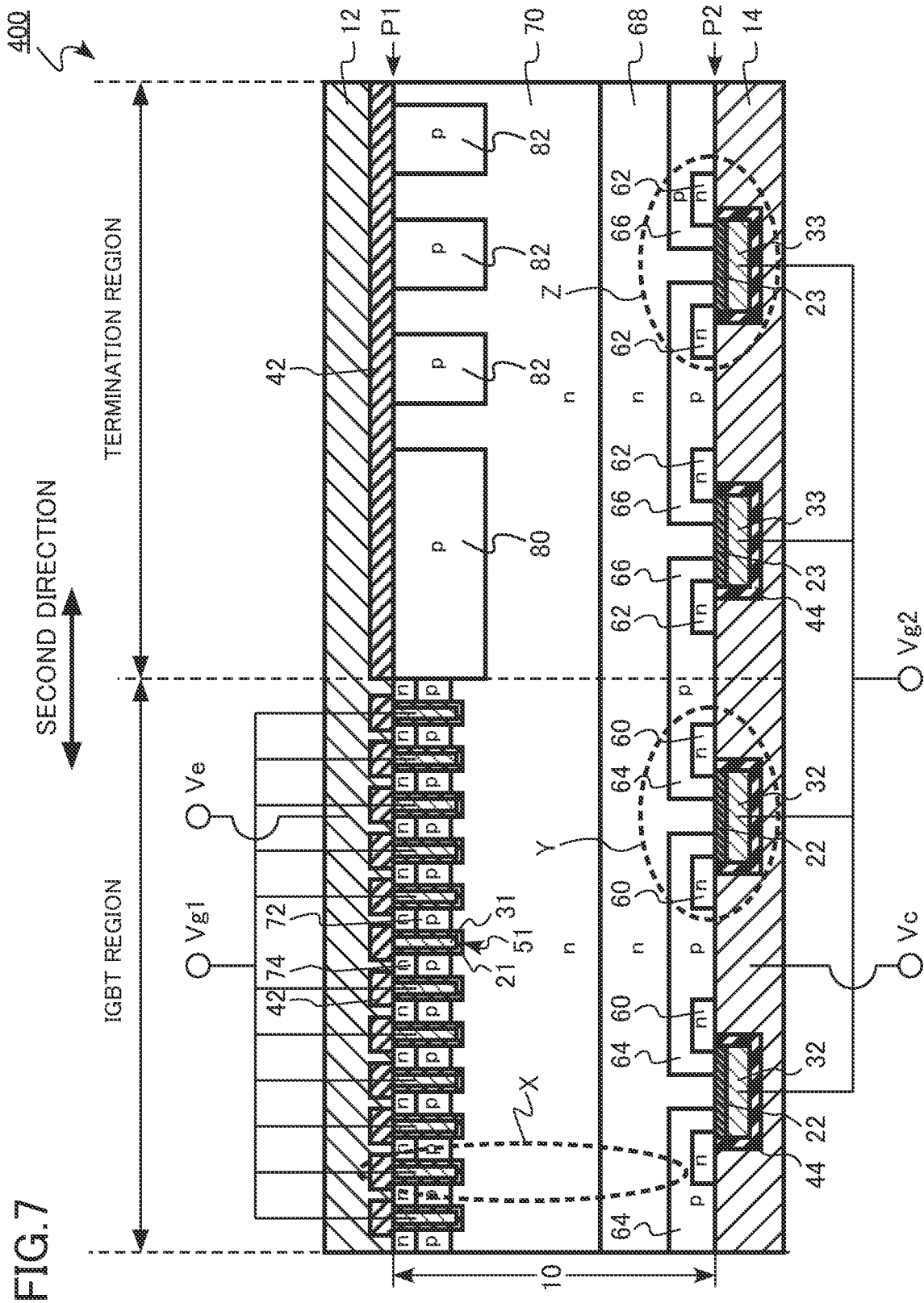
FIG. 7 is a schematic cross-sectional view of the semiconductor device of the fourth embodiment.

FIG. 7 is a schematic cross-sectional view of the semiconductor device of the fourth embodiment. FIG. 7 is a cross-sectional view taken along the line BB' of FIG. 6A.

The IGBT 400 of the fourth embodiment includes a semiconductor layer 10, an upper electrode 12 (first electrode), a lower electrode 14 (second electrode), a first gate insulating film 21, a second gate insulating film 22, a third gate insulating film 23, a first gate electrode 31, a second gate electrode 32, a third gate electrode 33, a surface interlayer insulating layer 42, a back surface interlayer insulating layer 44, a first electrode pad 101, and a second electrode pad 102.

The IGBT region 400a operates as an IGBT. The termination region 400b has a function of suppressing a reduction in breakdown voltage at the end of the IGBT region 400a.

The IGBT region 400a includes a first transistor having the first gate electrode 31 and a second transistor having the second gate electrode 32. The termination region 400b includes a third transistor having the third gate electrode 33.

The first transistor is controlled by the voltage applied to the first gate electrode 31. The second transistor is controlled by the voltage applied to the second gate electrode 32. The third transistor is controlled by the voltage applied to the third gate electrode 33.

The first transistor is provided on the first face P1 side of the semiconductor layer 10. The first transistor has a trench gate structure in which a gate electrode is provided in a trench. The first transistor is an IGBT.

The second transistor is provided on the second face P2 side of the semiconductor layer 10. The second transistor has a planar gate structure. The second transistor is a so-called back surface transistor. The second transistor is an n-type MOSFET having electrons as carriers.

The third transistor is provided on the second face P2 side of the semiconductor layer 10. The third transistor has a planar gate structure. The third transistor is a so-called back surface transistor. The third transistor is an n-type MOSFET having electrons as carriers.

The first transistor, the second transistor, and the third transistor are not clearly structurally separated from other structures. For example, a region surrounded by the broken line X in FIG. 7 corresponds to one unit of the first transistor. In addition, for example, a region surrounded by the broken line Y in FIG. 7 corresponds to one unit of the second transistor. In addition, for example, a region surrounded by the broken line Z in FIG. 7 corresponds to one unit of the third transistor.

In the semiconductor layer 10, a main gate trench 51 (first trench), an n-type first drain region 60 (sixth semiconductor region), an n-type second drain region 62 (seventh semiconductor region), a p-type first collector region 64 (fourth semiconductor region), a p-type second collector region 66 (fifth semiconductor region), an n-type buffer region 68, an n-type drift region 70 (first semiconductor region), a p-type base region 72 (second semiconductor region), an n-type emitter region 74 (third semiconductor region), a p-type intermediate region 80, and a p-type guard ring region 82 are provided.

The upper electrode 12 is an example of the first electrode. The lower electrode 14 is an example of the second electrode. The main gate trench 51 is an example of the first trench. The first drain region 60 is an example of the sixth semiconductor region. The second drain region 62 is an example of the seventh semiconductor region. The first collector region 64 is an example of the fourth semiconductor region. The second collector region 66 is an example of the fifth semiconductor region. The drift region 70 is an example of the first semiconductor region. The base region 72 is an example of the second semiconductor region. The emitter region 74 is an example of the third semiconductor region.

The semiconductor layer 10 has a first face P1 and a second face P2 opposite to the first face P1.

The upper electrode 12 is provided on the first face P1 side of the semiconductor layer 10. The upper electrode 12 functions as an emitter electrode of the first transistor.

The upper electrode 12 is electrically connected to the emitter region 74 in the IGBT region 400a. An emitter voltage (Ve) is applied to the upper electrode 12. The emitter voltage is, for example, 0 V.

The lower electrode 14 is provided on the second face P2 side of the semiconductor layer 10. In the IGBT region 400a, the lower electrode 14 functions as a collector electrode of the first transistor. The lower electrode 14 is electrically connected to the first collector region 64 in the IGBT region 400a.

The lower electrode 14 is electrically connected to the second collector region 66 in the termination region 400b. A collector voltage (Vc) is applied to the lower electrode 14. The collector voltage is, for example, equal to or more than 200 V and equal to or less than 6500 V.

The drift region 70 is an n-type semiconductor region. The drift region 70 is provided in the IGBT region 400a and the termination region 400b.

The base region 72 is a p-type semiconductor region. The base region 72 is provided in the IGBT region 400a.

The emitter region 74 is an n-type semiconductor region. The emitter region 74 is provided in the IGBT region 400a. The emitter region 74 is not provided in the termination region 400b.

The emitter region 74 is electrically connected to the upper electrode 12. The emitter region 74 is in contact with the upper electrode 12.

The first collector region 64 is a p-type semiconductor region. The first collector region 64 is provided in the IGBT region 400a.

The first collector region 64 is electrically connected to the lower electrode 14. The first collector region 64 is in contact with the lower electrode 14.

A part of the first collector region 64 faces the second gate electrode 32. In the first collector region 64 facing the second gate electrode 32, a channel of the second transistor controlled by the second gate electrode 32 is formed.

The second collector region 66 is a p-type semiconductor region. The second collector region 66 is provided in the termination region 400b.

The second collector region 66 is electrically connected to the lower electrode 14. The second collector region 66 is in contact with the lower electrode 14.

A part of the second collector region 66 faces the third gate electrode 33. In the second collector region 66 facing the third gate electrode 33, a channel of the third transistor controlled by the third gate electrode 33 is formed.

The p-type impurity concentration in the second collector region 66 of a portion facing the third gate electrode 33 is lower than the p-type impurity concentration in the first collector region 64 of a portion facing the second gate electrode 32.

The first drain region 60 is an n-type semiconductor region. The first drain region 60 is provided in the IGBT region 400a.

The second drain region 62 is an n-type semiconductor region. The second drain region 62 is provided in the termination region 400b.

The buffer region 68 is an n-type semiconductor region. The buffer region 68 is provided in the IGBT region 400a and the termination region 400b.

The p-type intermediate region 80 is provided in the termination region 400b. The intermediate region 80 is provided between the drift region 70 and the first face P1. The intermediate region 80 surrounds the IGBT region 400a.

The p-type guard ring region 82 is provided in the termination region 400b. The guard ring region 82 is provided between the drift region 70 and the first face P1. The guard ring region 82 surrounds the intermediate region 80. For example, a plurality of guard ring regions 82 are provided.

By providing the intermediate region 80 and the guard ring region 82, the electric field strength at the end of the termination region 400b is reduced, so that the reduction in breakdown voltage when the IGBT 400 is OFF is suppressed.

The main gate trench 51 is provided in the IGBT region 400a.

The first gate electrode 31 is provided in the IGBT region 400a. The first gate electrode 31 is provided in the main gate trench 51. The first gate electrode 31 is electrically connected to the first electrode pad 101.

The first gate insulating film 21 is provided between the first gate electrode 31 and the semiconductor layer 10.

The second gate electrode 32 is provided in the IGBT region 400a. The second gate electrode 32 is provided on the second face P2 side of the semiconductor layer 10. The second gate electrode 32 is electrically connected to the second electrode pad 102.

The second gate insulating film 22 is provided between the second gate electrode 32 and the semiconductor layer 10.

The third gate electrode 33 is provided in the termination region 400b. The third gate electrode 33 is provided on the second face P2 side of the semiconductor layer 10. The third gate electrode 33 is electrically connected to the second electrode pad 102.

The third gate insulating film 23 is provided between the third gate electrode 33 and the semiconductor layer 10.

The surface interlayer insulating layer 42 is provided between the first gate electrode 31 and the upper electrode 12.

The back surface interlayer insulating layer 44 is provided between the second gate electrode 32 and the lower electrode 14. The back surface interlayer insulating layer 44 is provided between the third gate electrode 33 and the lower electrode 14.

The first electrode pad 101 is provided on the first face P1 side of the semiconductor layer 10. The first electrode pad 101 is electrically connected to the first gate electrode 31. The first electrode pad 101 and the first gate electrode 31 are connected to each other by, for example, a metal wiring (not shown). A first gate voltage (Vg1) is applied to the first electrode pad 101.

The second electrode pad 102 is provided on the second face P2 side of the semiconductor layer 10. The second electrode pad 102 is electrically connected to the second gate electrode 32 and the third gate electrode 33. The second electrode pad 102 and each of the second gate electrode 32 and the third gate electrode 33 are connected to each other by, for example, a metal wiring (not shown). A second gate voltage (Vg2) is applied to the second electrode pad 102.

The threshold voltage of the third transistor of the IGBT 400 is lower than the threshold voltage of the second transistor. The threshold voltage of the third transistor having the third gate electrode 33 is lower than the threshold voltage of the second transistor having the second gate electrode 32. The threshold voltage of the third transistor having the third gate electrode 33 is, for example, equal to or less than two-thirds of the threshold voltage of the second transistor having the second gate electrode 32.

The p-type impurity concentration in the second collector region 66 of a portion facing the third gate electrode 33 is lower than the p-type impurity concentration in the first collector region 64 of a portion facing the second gate electrode 32. Since the p-type impurity concentration in the second collector region 66 of a portion facing the third gate electrode 33 is lower than the p-type impurity concentration in the first collector region 64 of a portion facing the second gate electrode 32, the threshold voltage of the third transistor is lower than the threshold voltage of the second transistor.

Next, a method of driving the IGBT 400 will be described.

The IGBT 400 is driven by the driving method shown in FIG. 3 of the first embodiment.

By applying the second turn-on voltage (Von2) to the second transistor and the third transistor at time tx, an anode short circuit occurs as in the RC-IGBT 100 of the first embodiment.

The occurrence of the anode short circuit prevents electrons from reaching the lower electrode 14 from the n-type buffer region 68 of the IGBT region 400a through the p-type first collector region 64. Therefore, the injection of holes from the p-type first collector region 64 into the drift region 70 of the IGBT region 400a is suppressed.

Similarly, the occurrence of the anode short circuit prevents electrons from reaching the lower electrode 14 from the n-type buffer region 68 of the termination region 400b through the p-type second collector region 66. Therefore, the injection of holes from the p-type second collector region 66 into the drift region 70 of the termination region 400b is suppressed.

The IGBT 400 of the fourth embodiment includes a second transistor as a back surface transistor on the back surface side of the semiconductor layer 10 in the IGBT region 400a. By turning on the second transistor during the turn-off operation of the IGBT 400, the turn-off loss is reduced. Therefore, it is possible to reduce the power consumption of the IGBT 400.

In addition, in the IGBT 400 of the fourth embodiment, the termination region 400b is provided around the IGBT region 400a. In the termination region 400b, the intermediate region 80 and the guard ring region 82 are provided. By providing the intermediate region 80 and the guard ring region 82, the electric field strength at the end of the IGBT region 400a is reduced, so that the reduction in breakdown voltage when the IGBT 400 is OFF is suppressed.

When the IGBT 400 is ON, an on-current also flows between the upper electrode 12 and the lower electrode 14 in the termination region 400b. Therefore, when the IGBT 400 is ON, carriers are also accumulated in the drift region 70 of the termination region 400b. In other words, when the IGBT 400 is ON, carriers spread up to the termination region 400b where the first transistor is not present on the surface.

During the turn-off operation of the IGBT 400, it is necessary to discharge the carriers accumulated in the drift region 70 of the termination region 400b. However, there is no carrier discharge path on the surface side of the termination region 400b. For this reason, the carriers are concentrated and discharged at the end of the IGBT region 400a. As a result, current concentration occurs at the end of the IGBT region 400a. Therefore, there is a possibility that the IGBT 400 will be damaged due to current concentration.

The IGBT 400 of the fourth embodiment includes a third transistor, which starts operating before the second transistor operates because the threshold voltage is low, on the back surface side of the semiconductor layer 10 in the termination region 400b. By turning on the third transistor at time tx, the injection of holes into the drift region 70 of the termination region 400b is suppressed before the injection of holes into the drift region 70 of the IGBT region 400a. As a result, the amount of holes in the drift region 70 of the termination region 400b is reduced before the amount of holes in the drift region 70 of the IGBT region 400a is reduced.

Therefore, it is possible to suppress the occurrence of current concentration at the end of the IGBT region 400a during the turn-off operation of the IGBT 400. As a result, damage to the IGBT 400 due to current concentration can be suppressed.

From the viewpoint of suppressing the damage to the IGBT 400 due to current concentration, the threshold voltage of the third transistor having the third gate electrode 33 is preferably equal to or less than two-thirds of the threshold voltage of the second transistor having the second gate electrode 32, more preferably half the threshold voltage of the second transistor having the second gate electrode 32.

In addition, by making the thickness of the third gate insulating film 23 smaller than the thickness of the second gate insulating film 22, it is possible to make the threshold voltage of the third transistor lower than the threshold voltage of the second transistor.

In addition, by making the channel length of the third transistor smaller than the channel length of the second transistor, it is possible to make the threshold voltage of the third transistor lower than the threshold voltage of the second transistor.

As described above, according to the fourth embodiment, it is possible to realize an IGBT in which damage due to current concentration is suppressed.

Fifth Embodiment

A semiconductor device of a fifth embodiment includes: a transistor region including a semiconductor layer having a first face and a second face opposite to the first face, a first transistor having a first gate electrode provided on a side of the first face of the semiconductor layer, and a second transistor having a second gate electrode provided on a side of the second face of the semiconductor layer; and an adjacent region adjacent to the transistor region and including the semiconductor layer and a third transistor having a third gate electrode electrically connected to the second gate electrode, having an occupancy ratio in a predetermined area higher than an occupancy ratio of the second gate electrode in the predetermined area, and provided on the side of the second face of the semiconductor layer.

The semiconductor device of the fifth embodiment is different from the semiconductor device of the fourth embodiment in that the occupancy ratio of the third gate electrode in a predetermined area is higher than the occupancy ratio of the second gate electrode in the predetermined area. Hereinafter, the description of a part of the content overlapping the fourth embodiment may be omitted.

The semiconductor device of the fifth embodiment is an IGBT 500 having a double-sided gate structure in which a gate electrode is provided on the surface side and the back surface side of a semiconductor layer. Hereinafter, a case where the first conductive type is the n type and the second conductive type is the p type will be described as an example.

The IGBT 500 includes an IGBT region 400a and a termination region 400b, similar to the IGBT 400 of the fourth embodiment. The termination region 400b surrounds the IGBT region 400a. The termination region 400b is adjacent to the IGBT region 400a.

Figure 8:
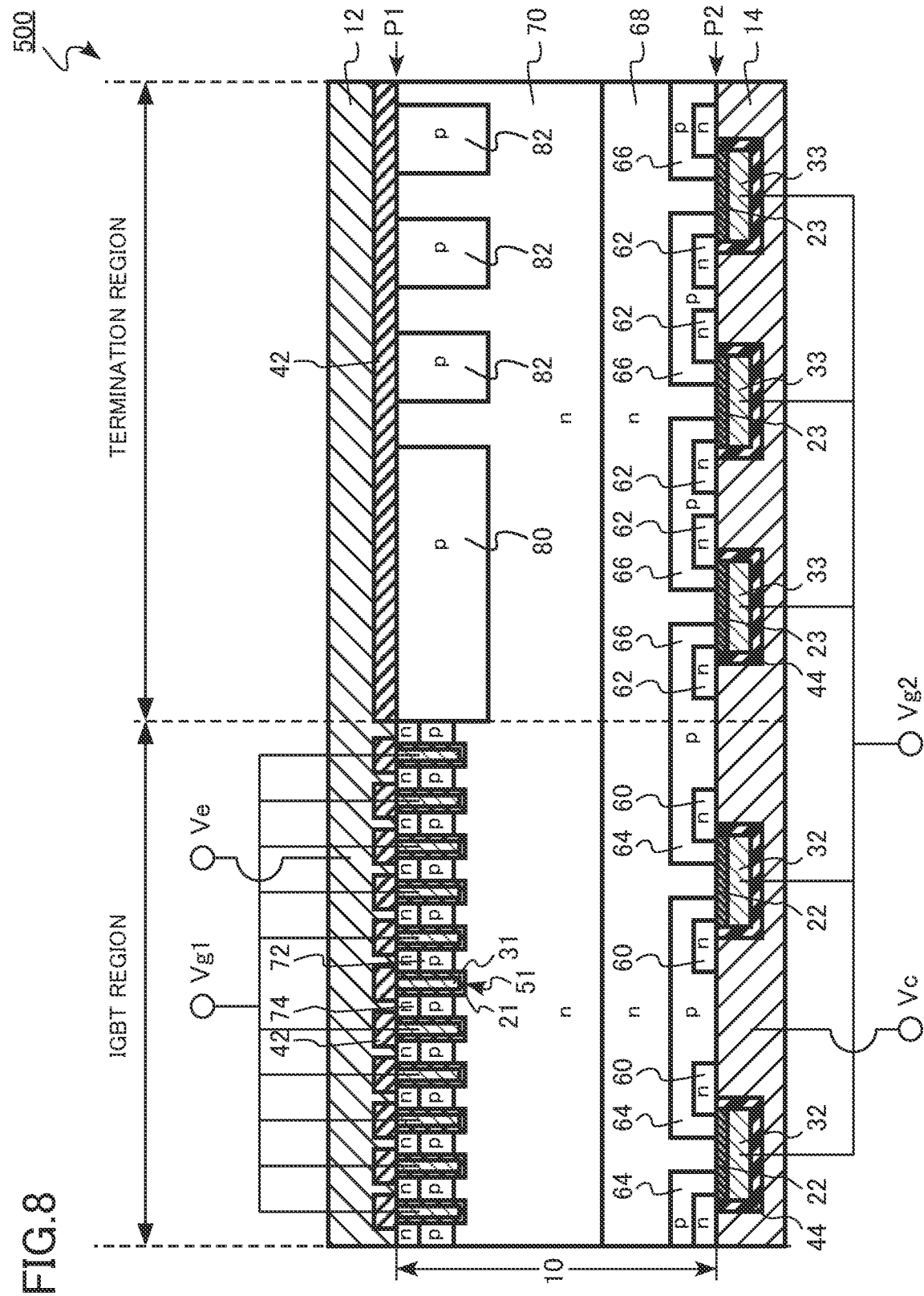
FIG. 8 is a schematic cross-sectional view of a semiconductor device of a fifth embodiment.

FIG. 8 is a schematic cross-sectional view of the semiconductor device of the fifth embodiment. FIG. 8 is a diagram corresponding to FIG. 7 of the fourth embodiment.

The IGBT 500 of the fifth embodiment includes a semiconductor layer 10, an upper electrode 12 (first electrode), a lower electrode 14 (second electrode), a first gate insulating film 21, a second gate insulating film 22, a third gate insulating film 23, a first gate electrode 31, a second gate electrode 32, a third gate electrode 33, a surface interlayer insulating layer 42, a back surface interlayer insulating layer 44, a first electrode pad 101, and a second electrode pad 102.

In the semiconductor layer 10, a main gate trench 51 (first trench), an n-type first drain region 60 (sixth semiconductor region), an n-type second drain region 62 (seventh semiconductor region), a p-type first collector region 64 (fourth semiconductor region), a p-type second collector region 66 (fifth semiconductor region), an n-type buffer region 68, an n-type drift region 70 (first semiconductor region), a p-type base region 72 (second semiconductor region), an n-type emitter region 74 (third semiconductor region), a p-type intermediate region 80, and a p-type guard ring region 82 are provided.

In the IGBT 500, the occupancy ratio of the third gate electrode 33 in the termination region 400b in a predetermined area is higher than the occupancy ratio of the second gate electrode 32 in the IGBT region 400a in the predetermined area. In other words, the density of the third gate electrodes 33 in the termination region 400b is higher than that of the second gate electrodes 32 in the IGBT region 400a. That is, the density of the third transistors in the termination region 400b is higher than the density of the second transistors in the IGBT region 400a.

In the IGBT 500, the distance between adjacent third gate electrodes 33 is smaller than the distance between adjacent second gate electrodes 32. By making the distance between the adjacent third gate electrodes 33 smaller than the distance between the adjacent second gate electrodes 32, the occupancy ratio of the third gate electrode 33 in the termination region 400b in a predetermined area is higher than the occupancy ratio of the second gate electrode 32 in the IGBT region 400a in the predetermined area.

The predetermined area is an area on the second face P2 that can include the termination region 400b. The predetermined area is, for example, an area of 50 μm×50 μm.

The occupancy ratio of the third gate electrode 33 in the termination region 400b in a predetermined area is, for example, equal to or more than 1.5 times the occupancy ratio of the second gate electrode 32 in the IGBT region 400a in the predetermined area.

In the IGBT 500, the threshold voltage of the third transistor and the threshold voltage of the second transistor are the same, for example. In the IGBT 500, for example, the p-type impurity concentration in the second collector region 66 of a portion facing the third gate electrode 33 is equal to the p-type impurity concentration in the first collector region 64 of a portion facing the second gate electrode 32.

The IGBT 500 is driven by the driving method shown in FIG. 3 of the first embodiment.

By applying the second turn-on voltage (Von2) to the second transistor and the third transistor at time tx, an anode short circuit occurs as in the IGBT 400 of the fourth embodiment.

The occurrence of the anode short circuit prevents electrons from reaching the lower electrode 14 from the n-type buffer region 68 of the IGBT region 400a through the p-type first collector region 64. Therefore, the injection of holes from the p-type first collector region 64 into the drift region 70 of the IGBT region 400a is suppressed.

Similarly, the occurrence of the anode short circuit prevents electrons from reaching the lower electrode 14 from the n-type buffer region 68 of the termination region 400b through the p-type second collector region 66. Therefore, the injection of holes from the p-type second collector region 66 into the drift region 70 of the termination region 400b is suppressed.

In the IGBT 500 of the fifth embodiment, the density of the third transistors in the termination region 400b is higher than the density of the second transistors in the IGBT region 400a. Therefore, when the second turn-on voltage (Von2) is applied to the second gate electrode 32 and the third gate electrode 33 at the same time at time tx, the amount of reduction in the injection of holes into the drift region 70 of the termination region 400b is larger than the amount of reduction in the injection of holes into the drift region 70 of the IGBT region 400a. As a result, the amount of holes in the drift region 70 of the termination region 400b is reduced before the amount of holes in the drift region 70 of the IGBT region 400a is reduced.

Therefore, it is possible to suppress the occurrence of current concentration at the end of the IGBT region 400a during the turn-off operation of the IGBT 500. As a result, damage to the IGBT 500 due to current concentration can be suppressed.

From the viewpoint of suppressing the damage to the IGBT 500 due to current concentration, the occupancy ratio of the third gate electrode 33 in the termination region 400b in a predetermined area is preferably, for example, equal to or more than 1.5 times the occupancy ratio of the second gate electrode 32 in the IGBT region 400a in the predetermined area, more preferably equal to or more than twice the occupancy ratio of the second gate electrode 32 in the IGBT region 400a in the predetermined area.

As described above, according to the fifth embodiment, it is possible to realize an IGBT in which damage due to current concentration is suppressed.

In the first to fifth embodiments, the case where the semiconductor layer is single crystal silicon has been described as an example. However, the semiconductor layer is not limited to the single crystal silicon. For example, other single crystal semiconductors, such as single crystal silicon carbide, may be used.

In the first to fifth embodiments, the case of a stripe shape in which trenches are arranged in parallel to each other has been described as an example. However, embodiments can also be applied to a mesh-shaped trench in which trenches cross each other or a dot-shaped trench.

In the first to fifth embodiments, the case where the first conductive type is the n type and the second conductive type is the p type has been described as an example. However, the first conductive type can be the p type and the second conductive type can be the n type.

In the first to fifth embodiments, the case where the first transistor has a trench gate structure has been described as an example. However, the first transistor may have a planar gate structure.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a transistor region including:
a semiconductor layer having a first face and a second face opposite to the first face;
a first transistor having a first gate electrode provided on a first face side of the semiconductor layer; and
a second transistor having a second gate electrode provided on a second face side of the semiconductor layer; and
an adjacent region adjacent to the transistor region and including:
the semiconductor layer; and
a third transistor having a third gate electrode electrically connected to the second gate electrode and provided on the second face side of the semiconductor layer, and the third transistor having an absolute value of a threshold voltage smaller than an absolute value of a threshold voltage of the second transistor.

2. The semiconductor device according to claim 1, further comprising:
a first electrode in contact with the first face; and
a second electrode in contact with the second face,
wherein the semiconductor layer includes:
a first semiconductor region of a first conductive type;
a second semiconductor region of a second conductive type provided between the first semiconductor region and the first face and facing the first gate electrode;
a third semiconductor region of a first conductive type provided between the second semiconductor region and the first face and in contact with the first electrode;
a fourth semiconductor region of a second conductive type provided between the first semiconductor region and the second face, facing the second gate electrode, and in contact with the second electrode;
a fifth semiconductor region of a second conductive type provided between the first semiconductor region and the second face, facing the third gate electrode, and in contact with the second electrode;
a sixth semiconductor region of a first conductive type provided between the fourth semiconductor region and the second face and in contact with the second electrode; and
a seventh semiconductor region of a first conductive type provided between the fifth semiconductor region and the second face and in contact with the second electrode,
wherein a second conductive type impurity concentration in a portion of the fifth semiconductor region facing the third gate electrode is lower than a second conductive type impurity concentration in a portion of the fourth semiconductor region facing the second gate electrode.

3. The semiconductor device according to claim 1, wherein the absolute value of the threshold voltage of the third transistor is equal to or less than two-thirds of the absolute value of the threshold voltage of the second transistor.

4. The semiconductor device according to claim 1, wherein the semiconductor layer includes a first trench provided in the first face side, and
the first gate electrode is provided in the first trench.

5. The semiconductor device according to claim 1, wherein the semiconductor layer includes a second trench provided in the second face side and a third trench provided in the second face side,
the second gate electrode is provided in the second trench, and
the third gate electrode is provided in the third trench.

6. The semiconductor device according to claim 1, further comprising:
a diode region including the semiconductor layer and a diode, the adjacent region being provided between the transistor region and the diode region.

7. The semiconductor device according to claim 1, wherein the adjacent region surrounds the transistor region.

* * * * *